United States Patent [19]

Nakamura

[11] Patent Number: 5,296,835

[45] Date of Patent: Mar. 22, 1994

[54] VARIABLE RESISTOR AND NEURO DEVICE USING THE VARIABLE RESISTOR FOR WEIGHTING

[75] Inventor: Takashi Nakamura, Kyoto, Japan

[73] Assignee: Rohm Co., Ltd., Kyoto, Japan

[21] Appl. No.: 83,570

[22] Filed: Jun. 30, 1993

[30] Foreign Application Priority Data

Jul. 1, 1992 [JP] Japan .................................. 4-174558

[51] Int. Cl.$^5$ ............................................. H01C 7/10
[52] U.S. Cl. ..................................... 338/130; 338/20; 338/204; 338/322; 338/332; 338/333; 338/334; 257/537
[58] Field of Search .................... 338/13, 20, 204, 322, 338/332, 333, 334; 257/536, 537

[56] References Cited

U.S. PATENT DOCUMENTS

| | | | |
|---|---|---|---|
| 3,659,149 | 4/1972 | Fleming | 315/153 |
| 5,070,385 | 12/1991 | Evans, Jr. et al. | 257/537 |
| 5,119,329 | 6/1992 | Evans, Jr. et al. | 365/145 |
| 5,130,773 | 7/1992 | Tsukada | 257/258 |

*Primary Examiner*—Marvin M. Lateef
*Attorney, Agent, or Firm*—Steven M. Rabin

[57] ABSTRACT

A Neuro device is a representation of a nerve cell constituting human brains, eyes and the like, that is, a neuron by an electronic circuit. A circuit of the Neuro device according to the present invention comprises n (n : natural number) input terminals 4, n variable resistors 8 (the resistance values of the n variable resistors 8 are respectively set to R1, R2,..., Rn) respectively connected to the input terminals 4, and an arithmetic circuit 100 to which signals from the variable resistors 8 are together applied, and an output terminal 5 to which a signal from the arithmetic circuit 100 is outputted. The variable resistor 8 is so constructed that a chalcogenide semiconductor is interposed between a pair of electrodes. The chalcogenide semiconductor can be reversibly transferred to a high resistive amorphous state and a low resistive crystallized state by applying a predetermined write voltage. In the present invention, a predetermined proportion of the chalcogenide semiconductor interposed between the pair of electrodes is brought into a crystallized state, while the remaining proportion thereof is brought into an amorphous state, thereby to construct a variable resistor having a desirable resistance value.

19 Claims, 17 Drawing Sheets

$R_{A0}$ $R_{B0}$

Rro

F I G. 17A
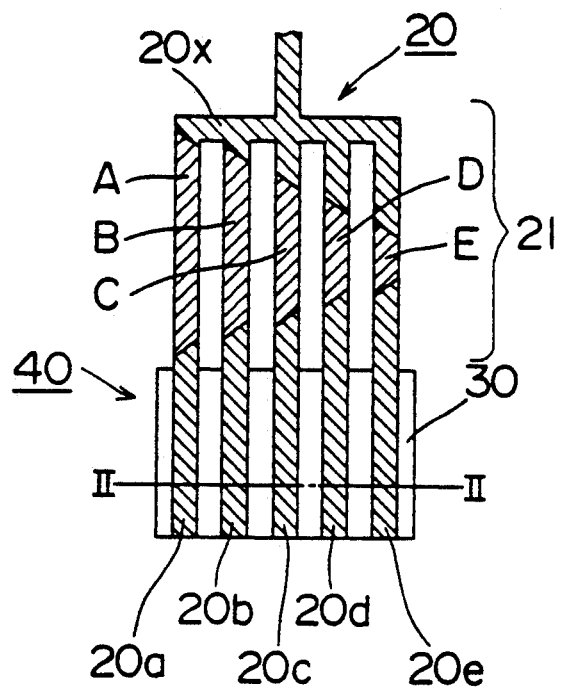
F I G. 17B
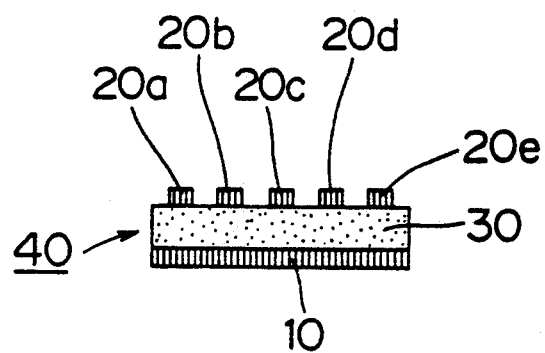

VARIABLE RESISTOR AND NEURO DEVICE USING THE VARIABLE RESISTOR FOR WEIGHTING

BACKGROUND OF THE INVENTION

1. Field of the Invention

The present invention relates generally to a Neuro device, and more particularly, to an improvement of a variable resistor playing a weighting role in a Neuro device.

2. Description of the Prior Art

A Neuro device is a representation of a nerve cell constituting human brains, eyes and the like, that is, a neuron by an electronic circuit.

FIG. 18 is a diagram schematically showing the construction of a neuron. Referring to FIG. 18, a neuron comprises a plurality of synapses and dendrites 1, one nerve cell 2, and one axon. The synapse and dendrite 1 corresponds to an input-output interface and an input line in an electronic circuit. The nerve cell 2 corresponds to an operational amplifier in the electronic circuit. The axon 3 corresponds to an output line in the electronic circuit. This neuron acts as follows. Signals V1, V2 and V3 are respectively applied to the three synapses and dendrites 1. Consequently, in the synapses and dendrites 1, weights W1, W2 and W3 are respectively added to the signals V1, V2 and V3. Accordingly, the signals entering the nerve cell 2 are weighted, to be V1.W1, V2.W2 and V3.W3. The weighted three signals are added in the nerve cell 2, to be $\alpha$=V1.W1, V2.W2 and V3.W3. If $\alpha$ exceeds a predetermined value, a signal V4 having a value inherent to this neuron is outputted to the succeeding nerve cell.

The Neuro device is a representation of this neuron by the electronic circuit. In the electronic circuit, the synapse, the nerve cell, and the axon and the dendrite constituting the neuron are generally formed of a resistor, an arithmetic circuit and wires, respectively.

FIGS. 19, 20 and 21 show examples of circuits of conventional Neuro devices.

The circuit shown in FIG. 19 comprises n (n : a natural number) input terminals 4, resistors R1, R2, ..., Rn respectively connected to the input terminals 4, an arithmetic circuit 100 to which signals from the resistors R1, R2, ..., Rn are together applied, and an output terminal 5 to which a signal from the arithmetic circuit 100 is outputted. When input voltages V1, V2, ..., Vn are respectively applied to the input terminals 4, currents flowing into the arithmetic circuit 100 through the resistors R1, R2, ..., Rn are respectively V1/R1, V2/R2, ..., Vn/Rn. That is, the input signals are respectively weighted by the resistors R1, R2, ..., Rn. In the arithmetic circuit 100, the input currents are added. If the total of the input currents is not less than a predetermined reference current, an output voltage Vx is outputted to the output terminal 5. This voltage Vx is applied to the succeeding Neuro device which is not shown.

In the circuit shown in FIG. 19, the resistance value of each of the resistors R1 to Rn is a fixed value, so that the weighting cannot be changed. Consequently, a pattern for weighting the input signal is fixed. Therefore, it is proposed that resistors R1, R2, ..., Rn connected to the respective input terminals 4 are made variable, as in an equivalent circuit of FIG. 20.

FIG. 21 shows an example of a circuit of a Neuro device in which resistors for weighting input signals are variable resistors. Referring to FIG. 21, reference numerals 6 denote weighting portions. The weighting portions 6 respectively output voltages corresponding to predetermined weights W1, W2, ..., Wn. Each of the voltages is applied to a gate of a MOSFET (Field Effect Transistor of Metal-Oxide Semiconductor) 7. The ON-state resistance value of the MOSFET 7 varies depending on the voltage applied to the gate thereof. Accordingly, a variable resistor for varying the ON-state resistance value of the MOSFET 7 by changing the voltage outputted from the weighting portion 6 is constructed. In the variable resistor of such construction, the weighting portion 6 has been conventionally constituted by a cell, a capacitor or a floating gate in a static RAM (see NIKKEI MICRODEVICES, December, 1990, pp. 42 to 51).

In the conventional circuit arrangement as shown in FIG. 21, however, it is difficult to obtain a reliable Neuro device. The reason for this is that the ON-state resistance value of the MOSFET 7 greatly varies depending on the very small change in the voltage applied to the gate thereof.

Furthermore, the conventional technique in which the weighting portion 6 is constituted by the cell or the capacitor in the static RAM has the disadvantages in that the area of the variable resistor is large, and data cannot be held in a state where a power supply voltage is off because the cell and the capacitor are volatile. On the other hand, the conventional technique in which the weighting portion 6 is constituted by the floating gate has the disadvantage in that it is difficult to implant a desirable amount of charge into the floating gate.

SUMMARY OF THE INVENTION

Therefore, a first object of the present invention is to overcome the disadvantages of the conventional techniques and to provide a variable resistor having a small occupied area, having a rewritable resistance value and being high in reliability and a Neuro device comprising the variable resistor as a weighting portion.

A second object of the present invention is to provide a Neuro device using a chalcogenide semiconductor for a weighting circuit.

A third object of the present invention is to provide an improved variable resistor using a chalcogenide semiconductor which can be utilized for a weighting portion in a Neuro device.

In order to attain the above described object, according to the present invention, a weighting portion in a Neuro device is constituted by a variable resistor including a chalcogenide semiconductor. The variable resistor comprises a pair of electrodes opposed to each other. The spacing between the pair of opposed electrodes is increased from one end of a space between the pair of opposed electrodes to the other end thereof. The space between the opposed electrodes is filled with the chalcogenide semiconductor.

In the variable resistor of the above described construction, if a predetermined write voltage is applied to the space between the electrodes, the chalcogenide semiconductor can be transferred from a high resistive state to a low resistive state. In addition, the write voltage is adjusted, thereby to make it possible to transfer a desirable proportion of the chalcogenide semiconductor into a low resistive state sequentially from the narrowest space between the electrodes to the widest space therebetween. As a result, the resistance value of the variable resistor can be set to a desirable resistance value.

Furthermore, the variable resistor can be returned to its original state by applying a reset pulse having a voltage value smaller than the write voltage and having a large current value to the space between the electrodes. Consequently, the resistance value of the variable resistor is rewritable.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 17A and 17B are diagrams showing the construction of a variable resistor which can be used as a weighting portion in a Neuro device according to a sixth embodiment of the present invention;

DESCRIPTION OF THE PREFERRED EMBODIMENTS

Figure 1:
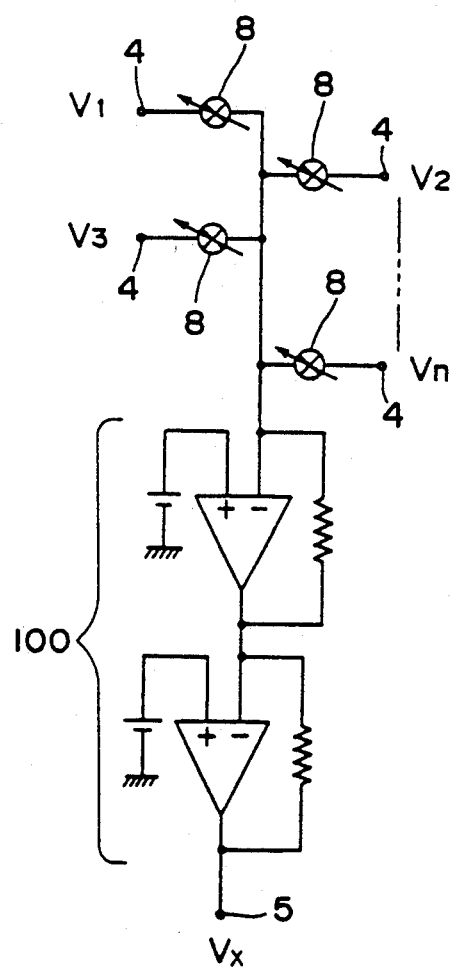
FIG. 1 is a diagram showing an electronic circuit of a Neuro device according to one embodiment of the present invention.

FIG. 1 is a diagram showing a circuit arrangement of a Neuro device according to one embodiment of the present invention. Referring to FIG. 1, a circuit of the Neuro device comprises n (n : a natural number) input terminals 4, n variable resistors 8 (the resistance values of the n variable resistors 8 are respectively set to R1, R2, ..., Rn) respectively connected to the input terminals 4, an arithmetic circuit 100 to which signals form the respective variable resistors 8 are together applied, and an output terminal 5 to which a signal from the arithmetic circuit 100 is outputted.

When input voltages V1, V2, ..., Vn are respectively applied to the input terminals 4, currents flowing into the arithmetic circuit 100 through the variable resistors 8 are respectively V1/R2, V2/R2, ..., Vn/Rn. Specifically, input signals are respectively weighted by the variable resistors 8. The arithmetic circuit 100 adds the input currents. If the total of the input currents is not less than a predetermined reference current, an output voltage Vx is outputted to an output terminal 5. This output voltage Vx is applied to the succeeding Neuro device which is not shown.

A lot of circuits of the above described construction are integrated on, for example, a silicon substrate. The circuits integrated are provided as an LSI including a plurality of Neuro devices.

The variable resistor 8 in the circuit of the Neuro device shown in FIG. 1 is of new construction using a chalcogenide semiconductor.

The new variable resistor 8 using this chalcogenide semiconductor will be described in detail.

A chalcogenide having as a base Group-VI elements such as S (sulfur), Se (selenium) and Te (tellurium) is a semiconductor material which is high in resistance in an amorphous state. This chalcogenide semiconductor can be transferred to a low resistive state by applying a voltage.

Figure 2:
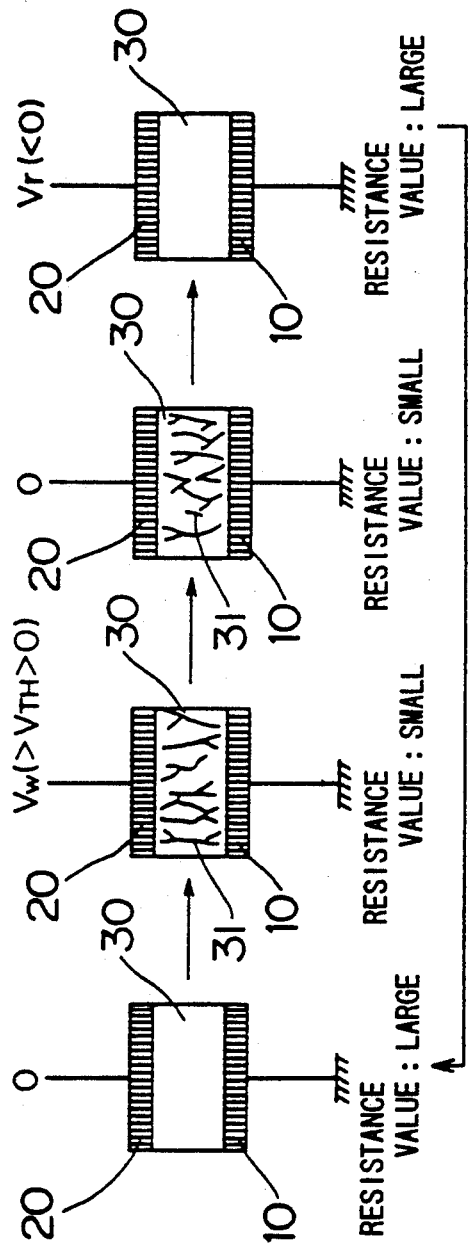
FIGS. 2A to 2D are diagrams for explaining the transfer in the state of a chalcogenide semiconductor.

Referring to FIG. 2A, a chalcogenide semiconductor 30 is interposed between a pair of conductor electrodes 10 and 20. As shown in FIG. 2A, the chalcogenide semiconductor 30 is in a high resistive amorphous state in a state where no voltage is applied to a space between the pair of electrodes 10 and 20. Consequently, a resistance value of the space between the pair of electrodes 10 and 20 is relatively large.

As shown in FIG. 2B, if a write voltage Vw more than a predetermined threshold voltage $V_{TH}$ is applied to the space between the pair of electrodes 10 and 20, a filament-shaped crystal path 31 which is relatively low in resistance is formed in the chalcogenide semiconductor 30. Therefore, the space between the electrodes 10 and 20 enters a relatively low resistive state. This state is not changed even if the voltage applied to the space between the pair of electrodes 10 and 20 is removed, as shown in FIG. 2C.

On the other hand, as shown in FIG. 2D, a reset pulse Vr having a suitable value and having a suitable duration is applied to the space between the pair of electrodes 10 and 20, thereby to make it possible to return the chalcogenide semiconductor 30 to its original amorphous state.

As shown in FIG. 2B, the threshold voltage $V_{TH}$ which is a boundary value in a case where the chalcogenide semiconductor 30 is transferred from a high resistive state to a low resistive state can be set to an arbitrary voltage from a low voltage of approximately 1 V to a high voltage of not less than 25 V by changing the thickness of the chalcogenide semiconductor 30, that is, the spacing between the pair of opposed electrodes 10 and 20. Accordingly, the write voltage Vw more than the set threshold voltage $V_{TH}$ is applied to the space between the electrodes 10 and 20, thereby to make it possible to transfer the chalcogenide semiconductor 30 from a high resistive state to a low resistive state.

Furthermore, as shown in FIG. 2D, the reset pulse Ve for returning the chalcogenide semiconductor 30 from a low resistive state to a high resistive amorphous state has a voltage value smaller than the write voltage Vw and has a large current value. If the reset pulse Vr is applied for a short time, the chalcogenide semiconductor 30 is transferred to a high resistive state.

A chalcogenide used in the embodiment of the present invention may be a simple substance such as Se (selenium) or Te (tellurium). In order to obtain a more stable effect, $Ge_X Te_{(1-X)}$ and $As_X S_{(1-X)}$ which are respectively compounds with Ge (germanium) and As (arsenic) are preferable. In addition, it is preferable to use a compound in the form of $Ge_A Te_B X_C Y_D$ such as $Ge_{24} Te_{72} Sb_2 S_2$ to which Sb (antimony) or the like is added. In each of the compounds, the resistance value in an amorphous state, the threshold voltage $V_{TH}$ at which the compound is transferred from an amorphous state (a high resistive state) to a low resistive state, and the like can be changed by changing the type and the mixture ratio of constituent elements. Accordingly, it is possible to obtain a chalcogenide semiconductor suitable for the application.

In the Neuro device according to the present embodiment, a non-volatile variable resistor which utilizes a chalcogenide semiconductor having the above described nature, whose resistance value can be electrically varied, and whose set resistance value is maintained is used.

Figure 3:
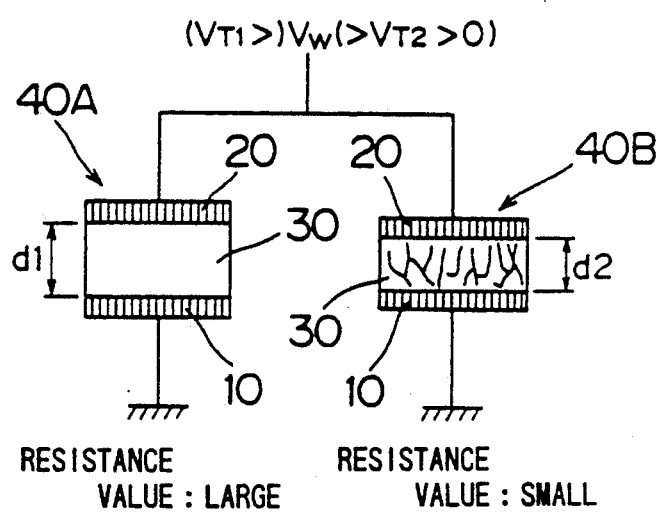
FIG. 3 is diagram for explaining one basic principle of a variable resistor which can be used as a weighting portion in a Neuro device according to the present invention.

Referring to FIG. 3, description is made of one basic principle of a variable resistor used in a Neuro device according to the present embodiment. Resistors 40A and 40B each having a chalcogenide semiconductor 30 interposed between a pair of conductor electrodes 10 and 20 are connected in parallel. A distance d1 between the electrodes 10 and 20 in the resistor 40A is made longer than a distance d2 between the electrodes 10 and 20 in the resistor 40B.

It is assumed that the chalcogenide semiconductors 30 in both the resistors 40A and 40B are in an amorphous state (a high resistive state). In this state, a voltage Vw is applied to the respective resistors 40A and 40B. Consequently, the voltage per unit volume (the electric field strength) in the resistor 40B in which the distance between the electrodes is short is larger than that in the resistor 40A in which the distance between the electrodes is long.

Let $V_{T1}$ and $V_{T2}$ respectively be a threshold voltage at which the resistor 40A is transferred from a high resistive state to a low resistive state and a threshold voltage at which the resistor 40B is transferred from a high resistive state to a low resistive state. Consequently, if the voltage Vw applied to the above described resistors 40A and 40B satisfies the condition $V_{T1} > Vw > V_{T2} > 0$, the chalcogenide semiconductor 30 in the resistor 40B is transferred from a high resistive state to a low resistive state. However, the chalcogenide semiconductor 30 in the resistor 40A remains in a high resistive state. That is, a state shown in FIG. 3 occurs.

If the resistance values of the resistors 40A and 40B at this time are respectively taken as $R_{A1}$ and $R_{B2}$, the total resistance value R1 is expressed by the following equation (1):

[Equation 1]

$$R1 = \frac{1}{R_{A1}} + \frac{1}{R_{B2}} \quad (1)$$

$$\therefore R1 = \frac{R_{A1} \cdot R_{B2}}{R_{A1} + R_{B2}}$$

Furthermore, when the voltage Vw is applied to the respective resistors 40A and 40B under the condition of $Vw > V_{T1} > V_{T2} > 0$, both the chalcogenide semiconductors 30 in the resistors 40A and 40B are transferred from a high resistive state to a low resistive state. If the resistance values of the resistors 40A and 40B at this time are respectively taken as $R_{B1}$ and $R_{B2}$, the total resistance value R2 is expressed by the following equation (2):

[Equation 2]

$$R2 = \frac{1}{R_{B1}} + \frac{1}{R_{B2}} \quad (2)$$

$$\therefore R2 = \frac{R_{B1} \cdot R_{B2}}{R_{B1} + R_{B2}}$$

Additionally, if the resistance values of the resistors 40A and 40B in a case where both the chalcogenide semiconductors 30 in the resistors 40A and 40B are in an amorphous state are respectively taken as $R_{A1}$ and $R_{A2}$, the total resistance value R3 is expressed by the following equation:

[Equation 3]

$$R3 = \frac{1}{R_{A1}} + \frac{1}{R_{A2}} \quad (3)$$

$$\therefore R3 = \frac{R_{A1} \cdot R_{A2}}{R_{A1} + R_{A2}}$$

Therefore, a variable resistor whose resistance value can be set to any one of a plurality of different resistance values (three resistance values in the above described case) by varying a write voltage is obtained by connecting chalcogenide semiconductor films which differ in thickness in parallel.

Figure 4:
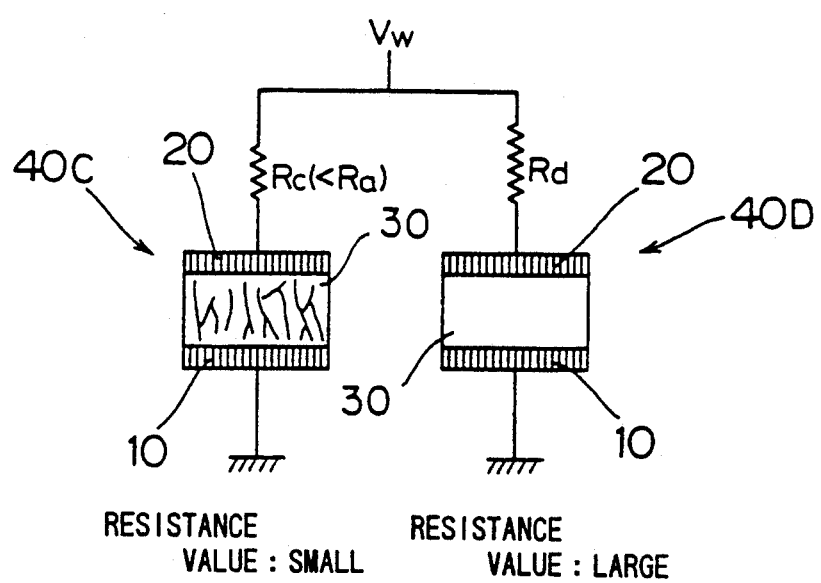
FIG. 4 is a diagram for explaining another basic principle of a variable resistor which can be used as a weighting portion in a Neuro device according to the present invention.

The variable resistor using the chalcogenide semiconductor may adopt another basic principle shown in FIG. 4.

Referring to FIG. 4, resistors 40C and 40D each having a chalcogenide semiconductor 30 interposed between a pair of conductor electrodes 10 and 20 are formed. The distances between the electrodes in the resistors 40C and 40D are equal to each other, and the resistors 40C and 40D have exactly the same structure. A resistor having a resistance value of Rc is connected in series with the resistor 40C. On the other hand, a resistor having a resistance value of Rd (Rc<Rd) is connected in series with the resistor 40C. A series connection between the resistor 40C and the resistor Rc and a series connection between the resistor 40D and the resistor Rd are connected in parallel.

It is assumed that the chalcogenide semiconductors 30 in both the resistors 40C and 40D are in an amorphous state (a high resistive state). In this state, a voltage Vw is applied to the above described parallel circuit. Consequently, voltages applied to the respective resistors 40C and 40D differ from each other, as in the circuit shown in FIG. 3. Specifically, the voltage applied to the resistor 40C to which the resistor having a relatively small resistance value Rc is connected is larger than the voltage applied to the resistor 40D. When a threshold voltage at which the resistors 40C and 40D are transferred from a high resistive state to a low resistive state is taken as $V_T$, the applied voltage (the write voltage) Vw is so adjusted that a voltage exceeding the threshold voltage $V_T$ is applied to the resistor 40C, while a voltage less than the threshold voltage $V_T$ is applied to the resistor 40D, thereby to obtain a state shown in FIG. 4.

If the resistance values of the resistors 40C and 40D which are in a high resistive state and the resistance values of the resistors 40C and 40D which are in a low resistive state are respectively taken as $R_A$ and $R_B$, the total resistance value R1 of the circuit shown in FIG. 4 in which only the resistor 40C enters a low resistive state is expressed by the following equation (4):

[Equation 6]

$$R1 = \frac{1}{R_1 + R_{B1}} + \frac{1}{R_2 + R_{A2}} \qquad (4)$$

$$\therefore R1 = \frac{(R_1 + R_{B1}) \cdot (R_2 + R_{A2})}{R_1 + R_{B1} + R_2 + R_{A2}}$$

Furthermore, if the applied write voltage Vw is so adjusted that the voltages applied to both the resistors 40C and 40D exceed the threshold voltage $V_T$, both the resistors 40C and 40D are transferred to a low resistive state. Therefore, the total resistance value R2 of this circuit is expressed by the following equation (5):

[Equation 7]

$$R2 = \frac{1}{R_1 + R_{B1}} + \frac{1}{R_2 + R_{B2}} \qquad (5)$$

$$\therefore R2 = \frac{(R_1 + R_{B1}) \cdot (R_2 + R_{B2})}{R_1 + R_{B1} + R_2 + R_{B2}}$$

Additionally, when both the two resistors 40C and 40D are in a high resistive state in the circuit shown in FIG. 4, the total resistance value R3 of the circuit is expressed by the following equation (6):

[Equation 8]

$$R3 = \frac{1}{R_1 + R_{A1}} + \frac{1}{R_2 + R_{A2}} \qquad (6)$$

$$\therefore R3 = \frac{(R_1 + R_{A1}) \cdot (R_2 + R_{A2})}{R_1 + R_{A1} + R_2 + R_{A2}}$$

A variable resistor can be also constructed by thus using a plurality of resistors respectively comprising chalcogenide semiconductors which are equal in thickness and connecting series connections between the respective resistors and resistors which differ in resistance value in parallel.

The variable resistor according to the present invention using a chalcogenide semiconductor which adopts either one of the basic principles will be described concretely.

Figure 5:
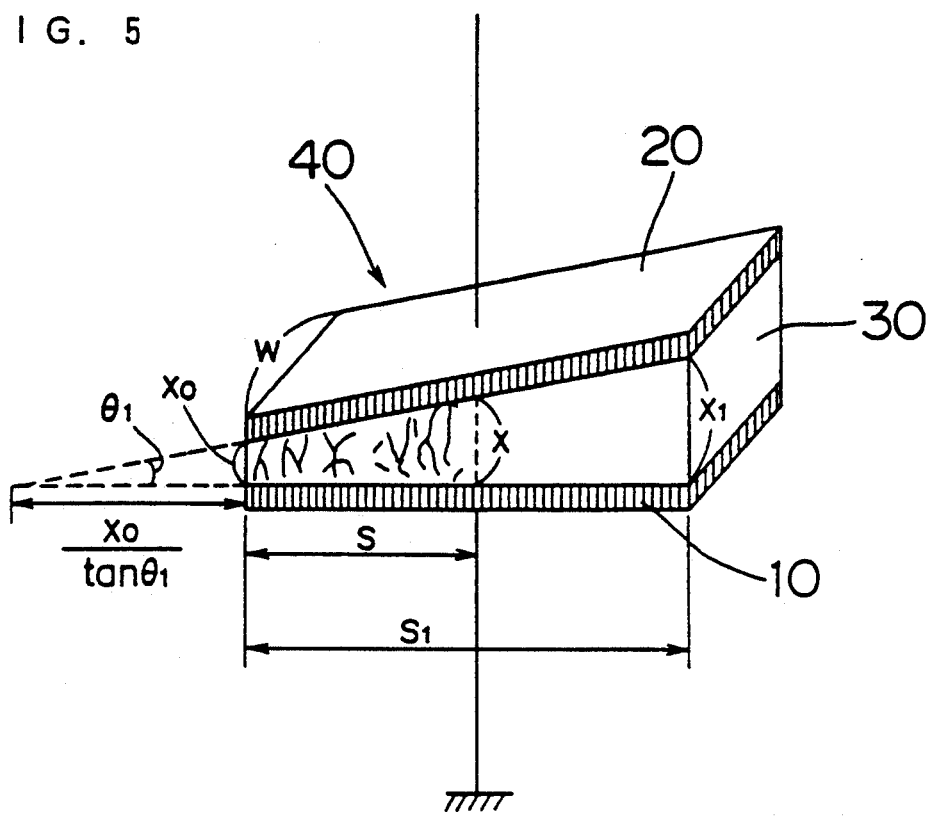
FIG. 5 is a diagram specifically showing the construction of a variable resistor which can be used as a weighting portion in a Neuro device according to a first embodiment of the present invention.

FIG. 5 is a diagram showing the construction of a variable resistor 40 used in a Neuro device according to a first embodiment of the present invention. The variable resistor 40 shown in FIG. 5 adopts the basic principle described with reference to FIG. 3.

Referring to FIG. 5, the variable resistor 40 has a chalcogenide semiconductor 30 interposed between a pair of conductor electrodes 10 and 20. A distance X between the pair of electrodes 10 and 20 differs depending on the place. Specifically, the distance between the electrodes 10 and 20 is the shortest, that is, X0 in one end of a space between the electrodes 10 and 20, while being the longest, that is, X1 in the other end thereof. Accordingly, it is possible to change the range in which the chalcogenide semiconductor 30 is crystallized by changing a voltage applied to the space between the pair of electrodes 10 and 20. As a result, a resistance value of the variable resistor 40 can be set to a desirable value.

The above described setting of the resistance value of the variable resistor 40 will be described in more detail. As shown in FIG. 5, the width, the length, the angle of inclination, the minimum thickness (the minimum distance between electrodes), and the maximum thickness (the maximum distance between electrodes) of the chalcogenide semiconductor 30 are respectively taken as W, S1, h1, X0, and X1. A predetermined voltage is applied to the space between the electrodes 10 and 20 so that the chalcogenide semiconductor 30 is transferred to a low resistive state until it attains a length of S at which the thickness (the distance between electrodes) thereof becomes X.

Figure 6A:
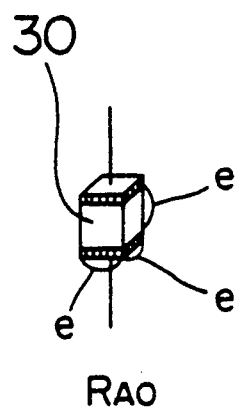
FIGS. 6A and 6B are diagrams for explaining a resistance value per unit volume of the variable resistor shown in FIG. 5.
Figure 6B:
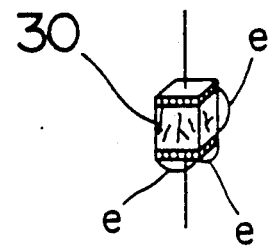

At this time, a resistance value $R_B$ in a region in a low resistive state on the left side and a resistance value $R_A$ in a region in a high resistive state on the right side are respectively expressed by the following equations (7) and (8). In the equations, $R_{B0}$ is a resistance value in a low resistive state of the chalcogenide semiconductor per unit volume of a cube which is e wide, e long and e high shown in FIG. 6B, and $R_{A0}$ is a resistance value in a high resistive state of the chalcogenide semiconductor per unit volume shown in FIG. 6A.

[Equation 4]

$$R_B = \int_{\frac{x}{\tan\theta_1}}^{S + \frac{x_0}{\tan\theta_1}} \frac{R_{B0} \cdot X}{W} dS \qquad (7)$$

-continued $$= \frac{R_{B0}}{w} \int_{\frac{x_0}{\tan\theta_1}}^{S + \frac{x_0}{\tan\theta_1}} (S \cdot \tan\theta_1 + x_0 \cdot S) dS$$

$$= \frac{R_{B0}}{w} \left[ \frac{S^2}{2} \cdot \tan\theta_1 + x_0 \cdot S \right]_{\frac{x_0}{\tan\theta_1}}^{S + \frac{x_0}{\tan\theta_1}}$$

$$= \frac{R_{B0} \cdot S}{w} \left( \frac{s}{2} \cdot \tan\theta_1 + 2x_0 \right)$$

$$R_A = \int_{S + \frac{x_0}{\tan\theta_1}}^{S_1 + \frac{x_0}{\tan\theta_1}} \frac{R_{A0} \cdot X}{w} dS \quad (8)$$

$$= \frac{R_{A0}}{w} \int_{S + \frac{x_0}{\tan\theta_1}}^{S_1 + \frac{x_0}{\tan\theta_1}} (S \cdot \tan\theta_1 + x_0 \cdot S) dS$$

$$= \frac{R_{A0}}{w} \left[ \frac{S^2}{2} \cdot \tan\theta_1 + x_0 \cdot S \right]_{S + \frac{x_0}{\tan\theta_1}}^{S_1 + \frac{x_0}{\tan\theta_1}}$$

$$= \frac{R_{A0}}{w} (s_1 - s) \cdot \left( \frac{s_1 - s}{s} \cdot \tan\theta_1 + 2x_0 \right)$$

Therefore, the total resistance value R of the variable resistor shown in FIG. 5 is expressed by the following equation (9) from the foregoing equations (7) and (8):

[Equation 5]

$$R = \frac{R_A \cdot R_B}{R_A + R_B} \quad (9)$$

$$= \frac{\frac{R_{A0} \cdot R_{B0}}{W} \cdot s \cdot (s_1 - s) \cdot \left( \frac{s}{2} \cdot \tan\theta_1 + 2x_0 \right) \cdot \left( \frac{s_1 + s}{2} \cdot \tan\theta_1 + 2x_0 \right)}{R_{A0} \cdot (s_1 - s) \cdot \left( \frac{s_1 - s}{2} \cdot \tan\theta_1 + 2x_0 \right) + R_{B0} \cdot s \cdot \left( \frac{s}{2} \cdot \tan\theta_1 + 2x_0 \right)}$$

Figure 7:
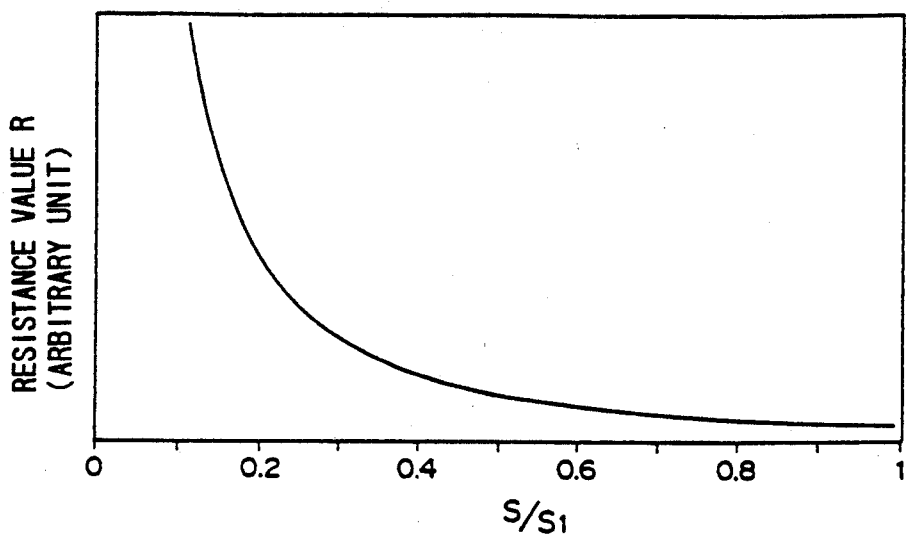
FIG. 7 is a graph showing the change in the resistance value in a case where the length of a crystallized region of a chalcogenide semiconductor is changed in the variable resistor shown in FIG. 5.

When $R_A/R_B = 10^4$ and $\theta_1 = 11°$ in the foregoing equation (9), the change of the total resistance value R in a case where the length S of a crystallized region of the chalcogenide semiconductor 30 is changed is shown in FIG. 7. In FIG. 7, the horizontal axis represents S/SI, and the vertical axis represents the total resistance value R (an arbitrary unit).

As can be seen from FIG. 7, if in the variable resistor 40 of the construction shown in FIG. 5, the ratio of the occupied area of the region in a low resistive state or the region in a high resistive state to the area of the chalcogenide semiconductor 30 (S/S1) is changed, the total resistance value R of the variable resistor 40 is changed.

Consequently, in the variable resistor 40 shown in FIG. 5, an arbitrary voltage is applied to the space between the pair of electrodes 10 and 20, thereby to make it possible to set the range in which the chalcogenide semiconductor 30 is in a low resistive state to a desirable range. Accordingly, the resistance value of the variable resistor 40 can be set to a desirable value by an electric signal. Furthermore, even if a voltage is applied to the space between the electrodes 10 and 20 to transfer the chalcogenide semiconductor and then, the voltage is removed, the resistance value of the variable resistor 40 is maintained because the variable resistor 40 is non-volatile.

According to the present embodiment, therefore, it is possible to obtain a variable resistor whose resistance value can be changed in steps by only the electric signal, and which has a very small area, is non-volatile, and is high in reliability.

Figure 8:
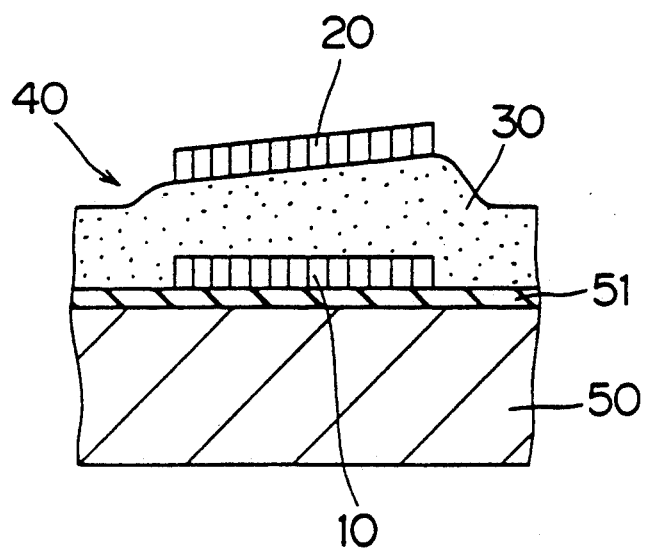
FIG. 8 is a cross sectional view showing the construction of the variable resistor used in the Neuro device according to the first embodiment of the present invention which is formed on a silicon substrate.

FIG. 8 is a cross sectional view showing the construction of the variable resistor used in the Neuro device according to the first embodiment of the present invention which is formed on a silicon substrate. Referring to FIG. 8, a silicon oxide insulation film 51 is formed on a silicon substrate 50, and a variable resistor 40 is formed thereon. The variable resistor 40 comprises a first electrode 10 formed on the oxide insulation film 51, a chalcogenide semiconductor film 30, which differs in thickness depending on the place, laminated on the first electrode 10, and a second electrode 20 formed on the chalcogenide semiconductor film 30.

FIGS. 9A to 9H are cross sectional views showing the manufacturing steps of the variable resistor 40 shown in FIG. 8. Referring to FIGS. 9A to 9H, description is made of a method of manufacturing the variable resistor 40 shown in FIG. 8.

Figure 9A:
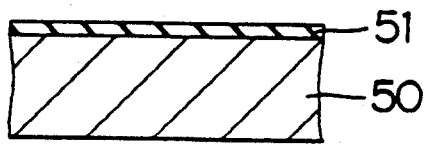
FIGS. 9A to 9H are cross sectional views showing the manufacturing steps of the variable resistor shown in FIG. 8.

Referring to FIG. 9A, a silicon substrate 50 is prepared, and a silicon oxide insulation film 51 is formed on the silicon substrate 50 by thermal oxidation.

Figure 9B:
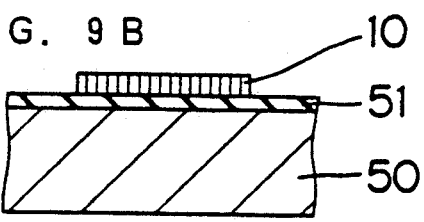

Referring to FIG. 9B, a conductor film made of platinum or the like is evaporated over the oxide insulation film 51 by sputtering or the like. Thereafter, an unnecessary conductor film is removed by etching, to form a first electrode 10.

Figure 9C:
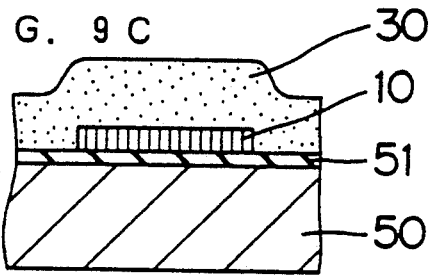

Referring to FIG. 9C, the chalcogenide semiconductor film 30 is laminated so as to cover the first electrode 10 by a known film forming process such as evaporation or sputtering in a semiconductor process.

Figure 9D:
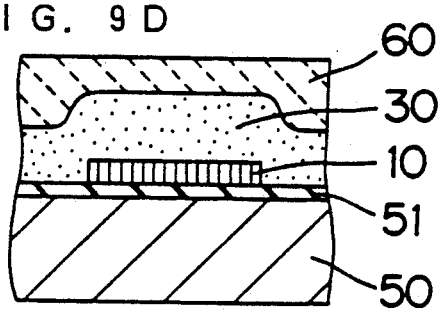

Referring to FIG. 9D, a positive resist 60 is applied over the chalcogenide semiconductor film 30.

Figure 9E:
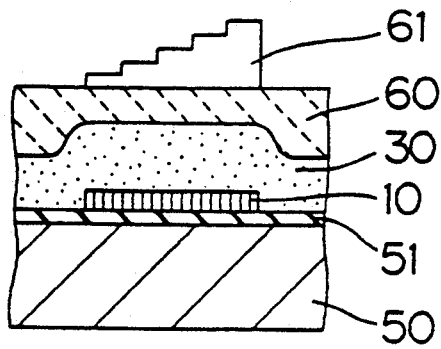

Referring to FIG. 9E, a Chrom mask 61 whose thickness is sequentially changed in steps is provided on the positive resist 60. The positive resist 60 is exposed to light utilizing this Chrom mask 61 as a mask. Consequently, the amount of light penetrating the Chrom mask 61 is changed in steps because the thickness of the Chrom mask 61 is sequentially changed in steps, so that the amount of exposure of the positive resist 60 is changed in steps. Consequently, if the exposure is followed by development, a positive resist 60 whose thickness is continuously changed is obtained, as shown in FIG. 9F.

Figure 9F:
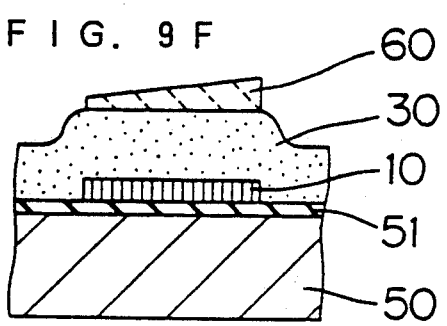
Figure 9G:
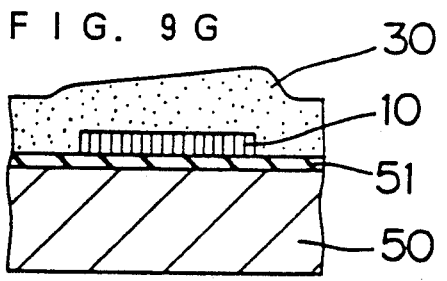

In the state shown in FIG. 9F, the positive resist 60 is etched. Consequently, the chalcogenide semiconductor film 30 below a thin portion of the positive resist 60 is removed in reliably large amounts, while the chalcogenide semiconductor film 30 below a thick portion of the positive resist 60 is removed in relatively small amounts. As a result, a chalcogenide semiconductor film 30 whose thickness is continuously changed is obtained, as shown in FIG. 9G.

Figure 9H:
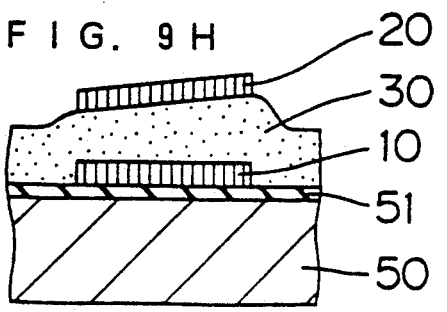

Referring to FIG. 9H, a conductor film made of platinum or the like is evaporated over the chalcogenide semiconductor film 30 by sputtering or the like. Thereafter, an unnecessary portion of the conductor film is removed by etching, to form a second electrode 20.

Figure 10:
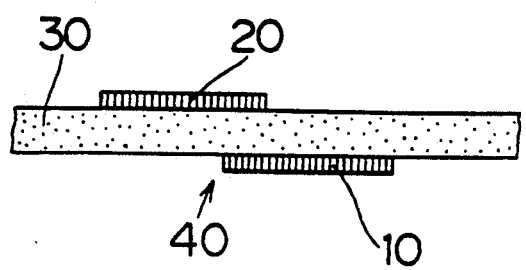
FIG. 10 is a cross sectional view showing a variable resistor which can be used as a weighting portion in a Neuro device according to a second embodiment of the present invention.

FIG. 10 is a cross sectional view showing the construction of a variable resistor 40 which can be used as a weighting portion in a Neuro device according to a second embodiment of the present invention. The variable resistor 40 shown in FIG. 10 comprises a chalcogenide semiconductor film 30 having a predetermined thickness, and a first electrode 10 and a second electrode 20 are respectively provided on both surfaces of the chalcogenide semiconductor film 30. The first electrode 10 and the second electrode 20 are not completely overlapped with each other but partly overlapped with each other as viewed from the top. Consequently, the distance between the first electrode 10 and the second electrode 20 continuously varies depending on the opposed position even if the thickness of the chalcogenide semiconductor film 30 is constant. Even in this construction, therefore, it is possible to set the resistance value of the variable resistor 40 to a desirable resistance value by selecting a voltage applied to a space between the first electrode 10 and the second electrode.

Figure 11A:
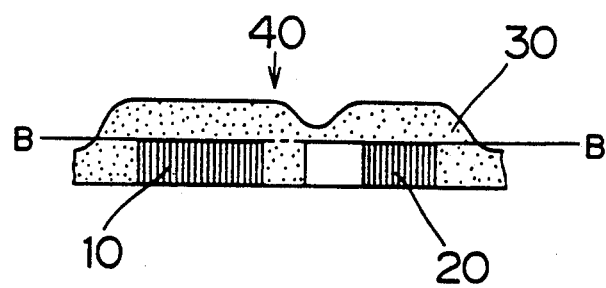
FIGS. 11A and 11B are diagrams showing a variable resistor which can be used as a weighting portion in a Neuro device according to a third embodiment of the present invention.
Figure 11B:
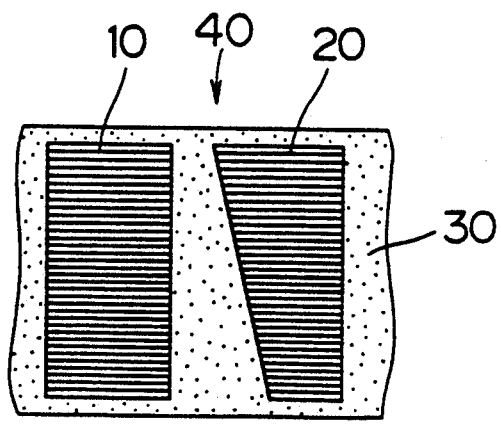

FIGS. 11A and 11B are diagrams showing a variable resistor 40 which can be used as a weighting portion in a Neuro device according to a third embodiment of the present invention, where FIG. 11A is a front view showing the variable resistor 40, and FIG. 11B is a cross sectional plan view taken along a line A—A shown in FIG. 11A.

In the variable resistor 40 according to the present embodiment, a first electrode 10 and a second electrode 20 are formed on the same plane. The spacing between opposed end faces of the first electrode 10 and the second electrode 20 is continuously changed from its small spacing to its large spacing. The two electrodes 10 and 20 are covered with a chalcogenide semiconductor 30. As a result, if a voltage is applied to a space between the first electrode 10 and the second electrode 20, a voltage is applied to the chalcogenide semiconductor film 30 interposed between the opposed end faces of the first electrode 10 and the second electrode 20. The chalcogenide semiconductor film 30 is selectively transferred to a low resistive state depending on the voltage applied.

Therefore, it is possible to obtain a variable resistor 40 which adopts the same principle as that shown in FIG. 5 or 8.

Figure 12:
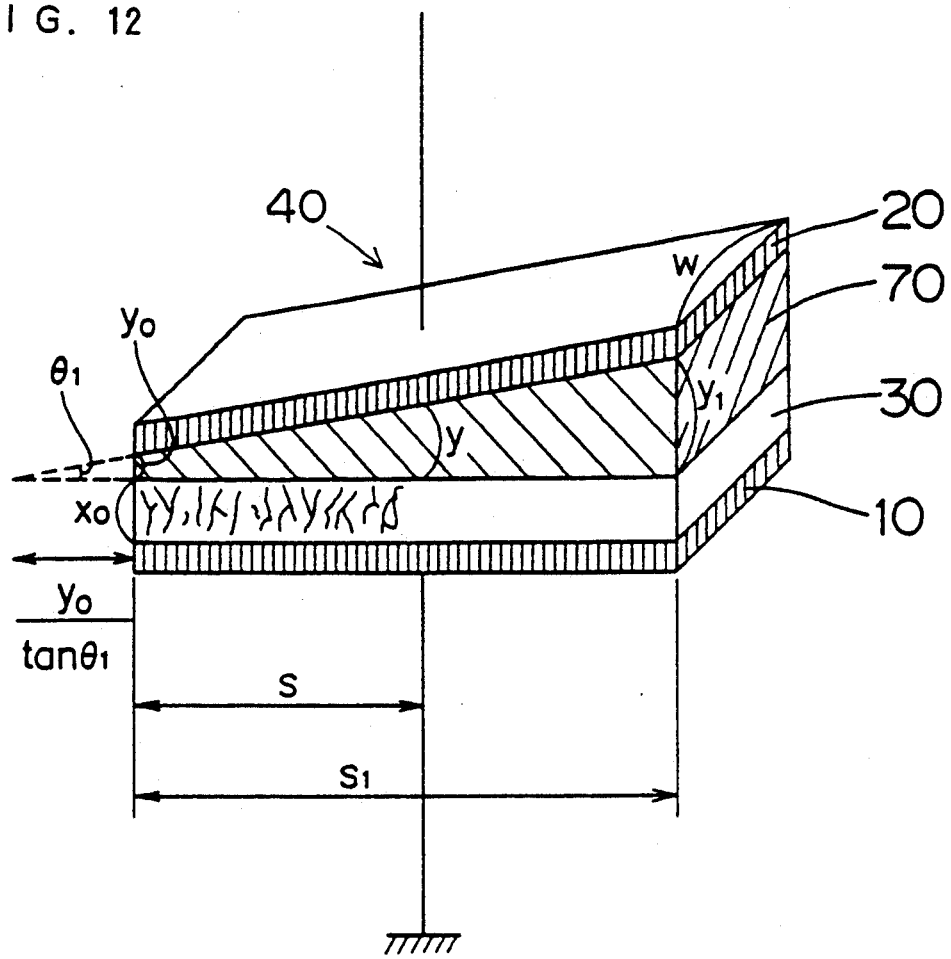
FIG. 12 is an illustration showing the construction of a variable resistor which can be used as a weighting portion in a Neuro device according to a fourth embodiment of the present invention.

FIG. 12 is a diagram showing the construction of a variable resistor 40 used in a Neuro device according to a fourth embodiment of the present invention. The variable resistor 40 shown in FIG. 12 adopts the basic principle described with reference to FIG. 4.

Referring to FIG. 12, the variable resistor 40 comprises a first electrode 10, a chalcogenide semiconductor film 30, having a uniform thickness, provided on the first electrode 10, a resistance film 70, whose thickness is continuously changed, provided on the chalcogenide semiconductor film 30, and a second electrode provided on the resistance film 70. In such construction, when a voltage is applied to a space between the first electrode 10 and the second electrode 20, a relatively large voltage is applied to the chalcogenide semiconductor 30 in contact with a thin portion of the resistance film 70, while a relatively small voltage is applied to the chalcogenide semiconductor 30 in contact with a thick portion of the resistance film 70. Accordingly, a voltage applied to the space between the first electrode 10 and the second electrode 20 is changed, thereby to make it possible to transfer a region from the left to a desirable position of the chalcogenide semiconductor 30 to a low resistive state. As a result, it is possible to set the resistance value of the variable resistor 40 to a desirable value.

The above described setting of the resistance value of the variable resistor 40 shown in FIG. 12 will be described in more detail. As shown in FIG. 12, the width and the length of the chalcogenide semiconductor film 30 and the resistance film 70 are respectively taken as W and S1. In addition, the thickness of the chalcogenide semiconductor film 30 is taken as X0, and the angle of inclination, the minimum thickness, and the maximum thickness of the resistance film 70 are respectively taken as $\theta 1$, Y0, and Y1. At this time, a predetermined voltage is applied to the space between the electrodes 10 and 20 so that the chalcogenide semiconductor 30 is transferred to a low resistive state until it attains a length of S at which the resistance film 70 attains a thickness of Y.

Figure 13:
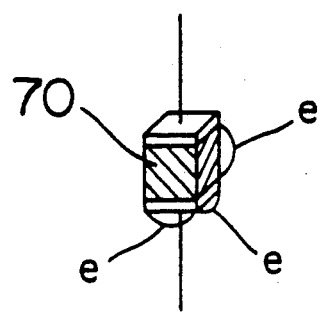
FIG. 13 is a diagram for explaining a resistance value per unit volume of the variable resistor shown in FIG. 12.

At this time, in FIG. 12, a resistance value $R_B$ in a region in a low resistive state on the left side and a resistance value $R_A$ in a region in a high resistive state on the right side are respectively expressed by the following equations (10) and (11). In the equations, $R_{R0}$ is a resistance value of the resistance film 70 per unit volume of a cube which is e wide, e long and e high shown in FIG. 13.

[Equation 9]

$$R_B = \int_{\frac{y_0}{\tan\theta_1}}^{S + \frac{y_0}{\tan\theta_1}} \frac{R_{B0} \cdot x_0 + R_{r0} \cdot Y}{w} dS \tag{10}$$

$$= \frac{1}{w} \int_{\frac{y_0}{\tan\theta_1}}^{S + \frac{y_0}{\tan\theta_1}} R_{B0} \cdot x_0 + R_{r0}(S \cdot \tan\theta_1 + y_0)$$

$$= \frac{1}{w} \left[ R_{B0} \cdot x_0 \cdot S + \frac{R_{r0} \cdot \tan\theta_1}{2} \cdot \right.$$

$$\left. S^2 + R_{r0} \cdot y_0 \cdot S \right]_{\frac{y_0}{\tan\theta_1}}^{S + \frac{y_0}{\tan\theta_1}}$$

$$= \frac{S}{w} \left( \frac{R_{r0} \cdot S}{2} \cdot \tan\theta_1 + 2R_{r0} \cdot y_0 + R_{B0} \cdot x_0 \right)$$

$$R_A = \int_{S + \frac{y_0}{\tan\theta_1}}^{S_1 + \frac{y_0}{\tan\theta_1}} \frac{R_{B0} \cdot x_0 + R_{r0} \cdot Y}{W} dS \tag{11}$$

-continued $$= \frac{1}{w} \int_{S + \frac{y_0}{\tan\theta_1}}^{S_1 + \frac{y_0}{\tan\theta_1}} R_{A0} + X_0 + R_{r0} \cdot (S \cdot \tan\theta_1 + y_0) dS$$

$$= \frac{1}{w} \left[ R_{A0} \cdot x_0 \cdot S + \frac{R_{r0} \cdot \tan\theta_1}{2} \cdot S^2 + R_{r0} \cdot y_0 \cdot S \right]_{S + \frac{y_0}{\tan\theta_1}}^{S_1 + \frac{y_0}{\tan\theta_1}}$$

$$= \frac{s_1 - s}{w} \cdot \left( \frac{R_{r0} \cdot (s_1 + s)}{2} \cdot \tan\theta_1 + 2R_{r0} \cdot y_0 + R_{B0} \cdot x_0 \right)$$

Accordingly, the total resistance value R of the variable resistor 40 shown in FIG. 12 is expressed by the following equation (12) from the foregoing equations (10) and (11):

[Equation 10]

$$R = \frac{R_A \cdot R_B}{R_A + R_B} \tag{12}$$

$$= \frac{\frac{2s(s_1 - s)}{W} \cdot \left( \frac{R_{r0} \cdot s}{2} \cdot \tan\theta_1 + 2R_{r0} \cdot y_0 + R_{A0} \cdot x_0 \right)\left( \frac{R_{r0}(s_1 + s)}{2} \cdot \tan\theta_1 + 2R_{r0} \cdot y_0 + R_{A0} \cdot x_0 \right)}{R_{r0} \cdot (s_1 - s)^2 \cdot \tan\theta_1 + 2R_{r0} \cdot y_0 + R_{B0} \cdot x_0 + R_{r0} \cdot s \cdot \tan\theta_1 + 2R_{r0} \cdot y_0 + R_{A0} \cdot x_0}$$

This equation also shows that the total resistance value R of the variable resistor 40 is changed if the ratio of the occupied area of the region in a low resistive state or the region in a high resistive state to the area of the chalcogenide semiconductor 30 is changed.

Consequently, the resistance value of the variable resistor 40 shown in FIG. 12 can be set to a desirable value by an electric signal, as in the variable resistor 40 shown in FIG. 5 as described above.

Figure 14:
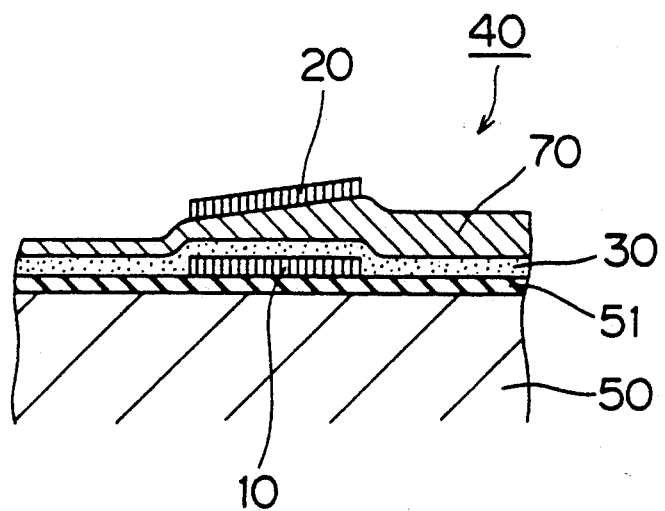
FIG. 14 is a cross sectional view showing the construction of the variable resistor used in the Neuro device according to the fourth embodiment of the present invention which is formed on a silicon substrate.

FIG. 14 is a cross sectional view showing the construction of the variable resistor 40 used in the Neuro device according to the fourth embodiment of the present invention which is formed on a silicon substrate. Referring to FIG. 14, a silicon oxide insulation film 51 is formed on the silicon substrate 50, and a variable resistor 40 is formed thereon. The variable resistor 40 comprises a first electrode 10 formed on the oxide insulation film 51, a chalcogenide semiconductor film 30, having a uniform thickness, laminated on the first electrode 10, a resistance film 70, whose thickness is changed, laminated on the chalcogenide semiconductor film 30, and a second electrode 20 formed on the resistance film 70.

FIGS. 15A to 15I are cross sectional views showing the manufacturing steps of the variable resistor 40 shown in FIG. 14. Referring to FIGS. 15A to 15I, description is made of a method of manufacturing the variable resistor 40 shown in FIG. 14.

Figure 15A:
FIGS. 15A to 15I are cross sectional views showing the manufacturing steps of the variable resistor shown in FIG. 14.

Referring to FIG. 15A, a silicon substrate 50 is prepared, and a silicon oxide insulation film 51 is formed on the silicon substrate 50 by thermal oxidation.

Figure 15B:
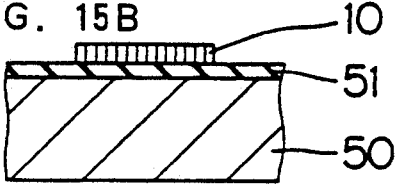

Referring to FIG. 15B, a conductor film made of platinum or the like is evaporated over the oxide insulation film 51 by sputtering or the like. Thereafter, an unnecessary conductor film is removed by etching, to from a first electrode 10.

Figure 15C:
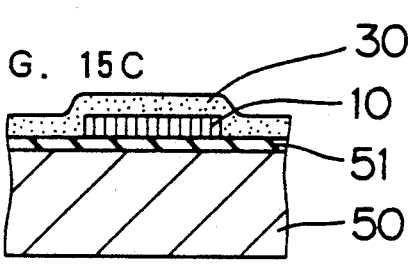

Referring to FIG. 15C, a chalcogenide semiconductor film 30 is laminated so as to cover the first electrode 10 by a known film forming process such as evaporation or sputtering in a semiconductor process.

Figure 15D:
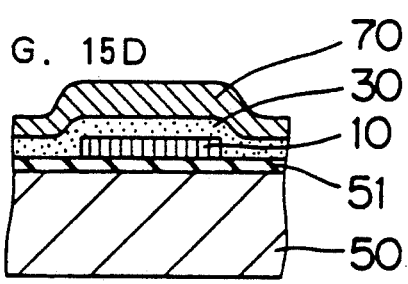

Referring to FIG. 15D, a resistance film 70 is formed on the chalcogenide semiconductor film 30.

Figure 15E:
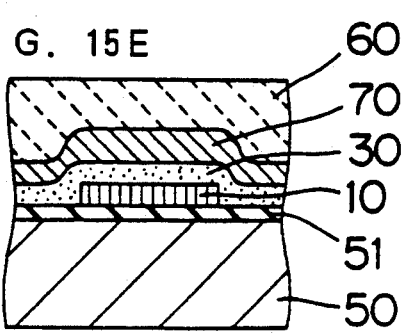

Referring to FIG. 15E, a positive resist 60 is applied over the resistance film 70.

Figure 15F:
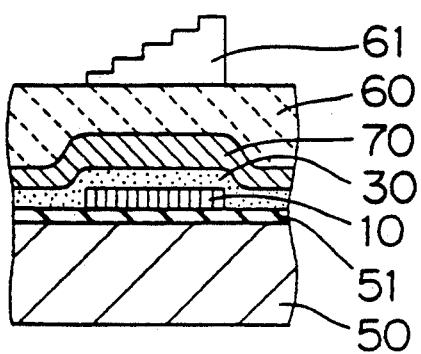

Referring to FIG. 15F, a Chrom mask 61 whose thickness is sequentially changed in steps is provided on the positive resist 60. The positive resist 60 is exposed to light utilizing this Chrom mask 61 as a mask. Consequently, the amount of light penetrating the Chrom mask 61 is changed in steps because the thickness of the Chrom mask 61 is sequentially changed in steps, so that the amount of exposure of the positive resist 60 is changed in steps. Consequently, if the exposure is followed by development, a positive resist 60 whose thickness is continuously changed is obtained, as shown in FIG. 15G.

Figure 15G:
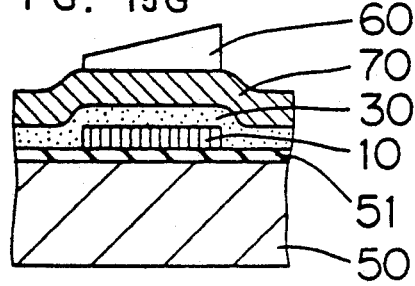
Figure 15H:
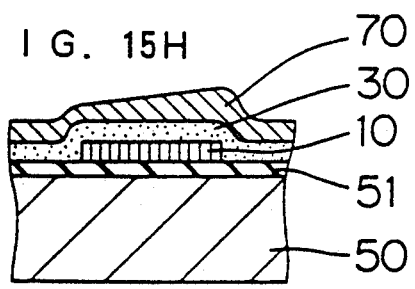

In the state shown win FIG. 15G, the positive resist 60 is etched. Consequently, the resistance film 70 below a thin portion of the positive resist 60 is removed in relatively large amounts, while the resistance film 70 below a thick portion of the positive resist 60 is removed in relatively small amounts. As a result, a resistance film 70 whose thickness is continuously changed is formed, as shown in FIG. 15G.

Figure 15I:
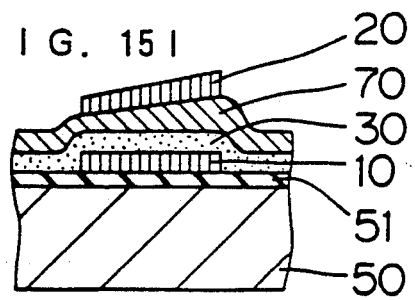

Referring to FIG. 15I, a conductor film made of platinum or the like is evaporated over the resistance film 70 by sputtering or the like. Thereafter, an unnecessary portion of the conductor film is removed by etching, to form a second electrode 20.

Figure 16A:
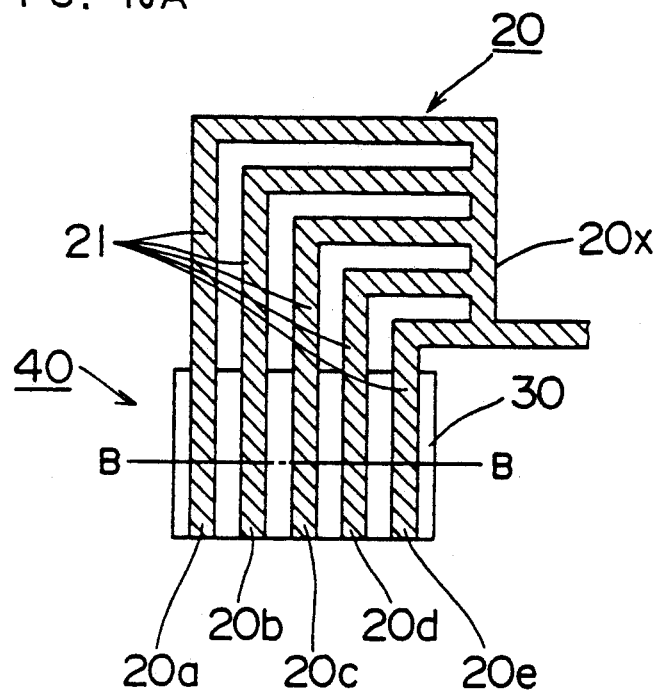
FIGS. 16A and 16B are diagrams showing the construction of a variable resistor which can be used as a weighting portion in a Neuro device according to a fifth embodiment of the present invention.
Figure 16B:
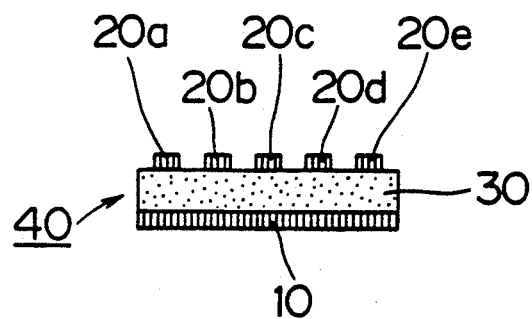
Figure 18:
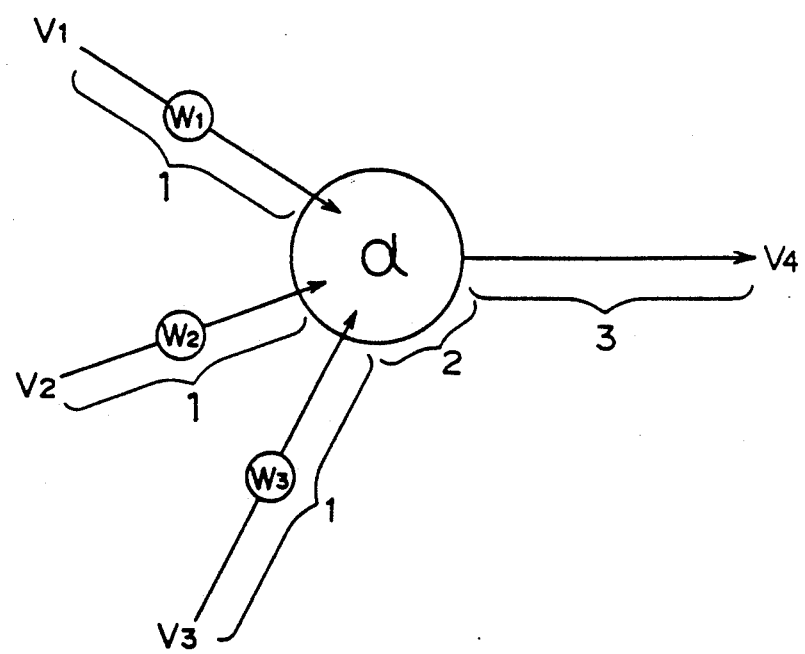
FIG. 18 is a diagram schematically illustrating the construction of a neuron.
Figure 19:
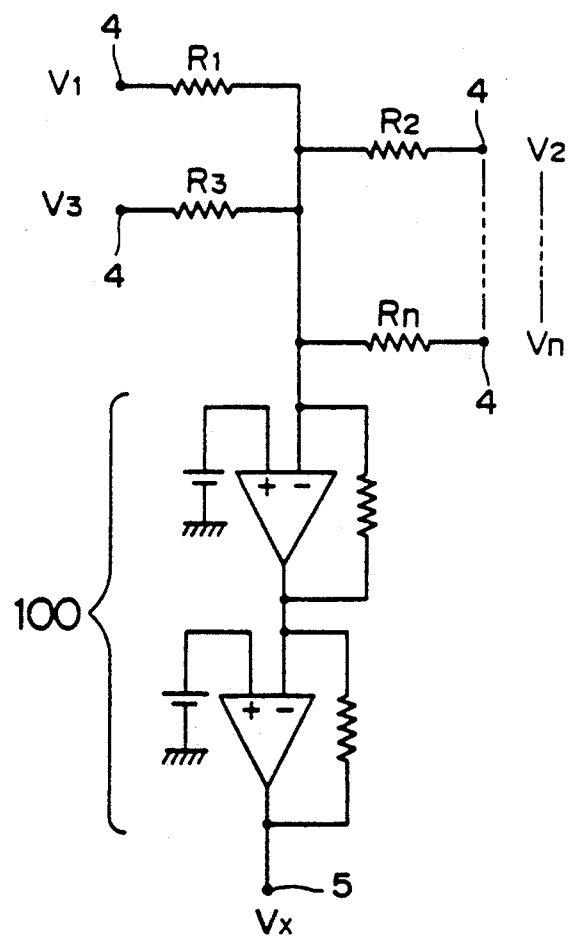
FIGS. 19, 20 and 21 are diagrams showing electronic circuits of conventional Neuro devices.
Figure 20:
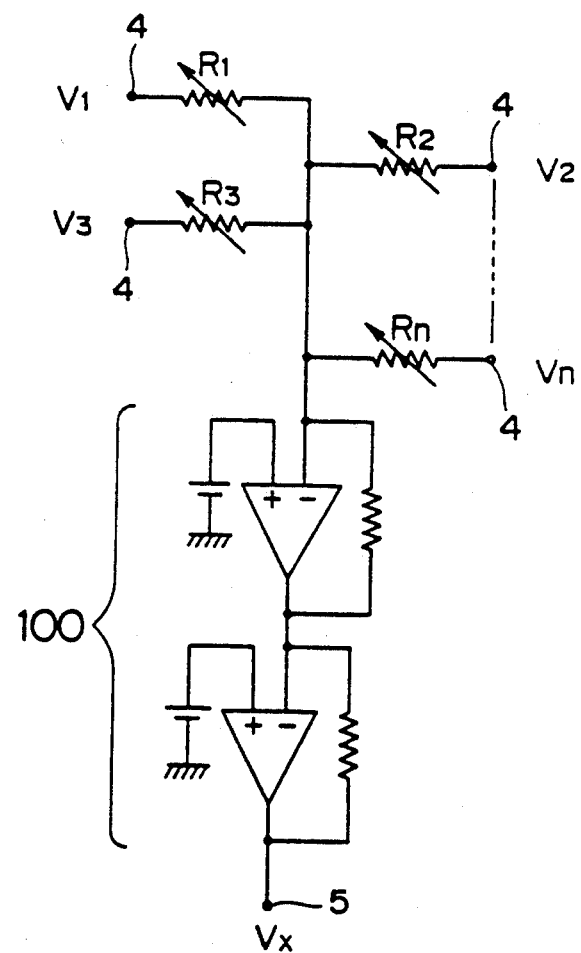
Figure 21:
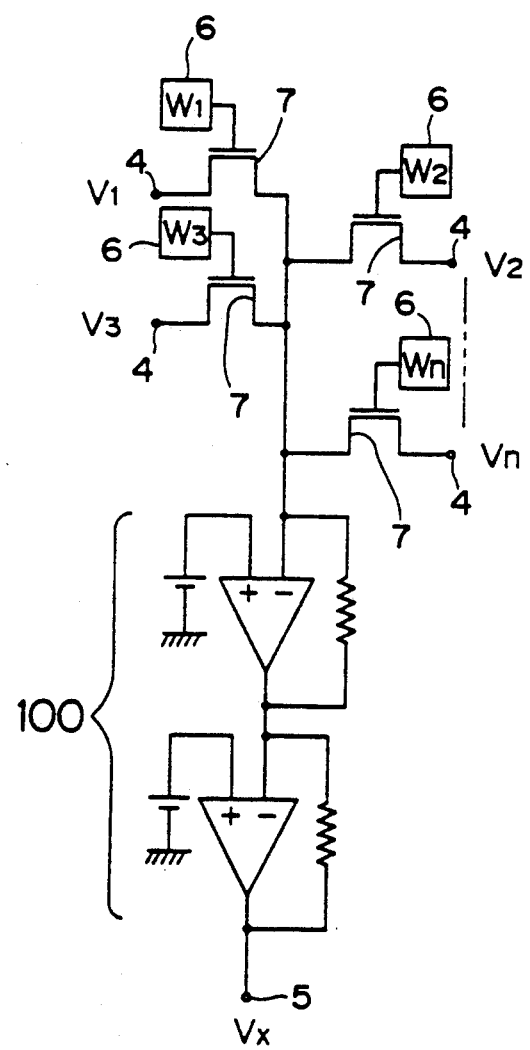

FIGS. 16A and 16B are diagrams showing the construction of a variable resistor 40 which can be used as a weighting portion in a Neuro device according to a fifth embodiment in the present invention, where FIG. 16A is a plan view showing the variable resistor 40, and FIG. 16B are cross sectional end view taken along a line B—B shown in FIG. 16A.

The variable resistor 40 according to the present embodiment comprises a chalcogenide semiconductor film 30 having a constant thickness, and a first electrode 10 is provided on the reverse surface of the chalcogenide semiconductor film 30. On the other hand, a second electrode provided on the surface of the chalcogenide semiconductor film 30 is a comb-shaped electrode 20, unlike the first electrode 10. More specifically, the comb-shaped electrode 20 comprises a plurality of small electrode portions 20a, 20b, 20c, 20d and 20e, which are parallel to each other, arranged on the surface of the chalcogenide semiconductor film 30, extending portions 21 respectively extending toward the outside of the chalcogenide semiconductor film 30 from the small electrode portions 20a to 20e, and a common portion 20X for together connecting the extending portions 21. A voltage applied to the common portion 20X is applied in parallel to the respective small electrode portions 20a, 20b, 20c, 20d and 20e through the extending portions 21. However, the respective lengths of the extending portions 21 differ from each other. Accordingly, the longer the extending portion 21 is, the larger the drop of the voltage in the extending portion 21 is. Accordingly, the voltage appearing in the small electrode portion having the long extending portion 21 becomes low. Consequently, it is possible to transfer the chalcogenide semiconductor film 30 beneath the respective small electrode portions to a low resistive state sequentially from the small electrode portion 20e to the small electrode portion 20a by selecting the voltage applied to the common portion 20x. A region where the chalcogenide semiconductor film 30 is transferred can be changed in steps. Accordingly, it is possible to change the resistance value in steps.

FIGS. 17A and 17B are diagrams showing the construction of a variable resistor 40 which can be used as a weighting portion in a Neuro device according to a sixth embodiment of the present invention, where FIG. 17A is a plan view, and FIG. 17B is a cross sectional end view taken along a line II—II shown in FIG. 17A.

The variable resistor 40 shown in FIGS. 17A and 17B also comprises a chalcogenide semiconductor film 30 having a constant thickness, a first electrode 10 provided on the reverse surface of the chalcogenide semiconductor film 30, and a comb-shaped electrode 20 provided on the surface of the chalcogenide semiconductor film 30, similarly to the variable resistor 40 shown in FIGS. 16A and 16B. The variable resistor shown in FIGS. 17A and 17B differs from the variable resistor shown in FIGS. 16A and 16B in that extending portions 21 in the comb-shaped electrode 20 are equal in length, and resistance regions A, B, C, D and E which differ in length are respectively formed in the extending portions 21. Consequently, the amounts of the drop of the voltage due to the resistance regions A, B, C, D and E differ from each other. Even if a predetermined voltage is applied to a common portion 20X, therefore, voltages appearing in respective small electrode portions 20a, 20b, 20c, 20d and 20e differ from each other. The voltage appearing in the small electrode portion 20e is the highest, while the voltage appearing in the small electrode portion 20a is the lowest. As a result, it is possible to transfer the chalcogenide semiconductor film 30 to a low resistive state in steps.

The variable resistor 40 shown in FIGS. 17A and 17B is advantageous in a case where the comb-shaped electrode 20 is formed of, for example, polysilicon. The reason for this is that it is possible to form the respective resistance regions A, B, C, D and E by implanting impurities into the extending portions 21 when the comb-shaped electrode 20 is formed of polysilicon.

A variable resistor 40 which can be used as a weighting portion in a Neuro device according to the present invention is not limited to the above described respective embodiments.

For example, the variable resistor 40 may be so constructed that the thickness of the chalcogenide semiconductor film 30 is sequentially changed in steps instead of continuously changing the thickness of the chalcogenide semiconductor film 30 in the embodiment shown in FIG. 5, 8 or 11.

Similarly, the variable resistor 40 may be so constructed that the thickness of the resistance film 70 is changed in steps without continuously changing the thickness of the resistance film 70 in the embodiment shown in FIG. 12 or FIG. 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Neuro device comprising:
   a plurality of input means to which signals are respectively inputted;
   weighting means respectively provided in said plurality of input means for respectively adding to the signals inputted to the input means weights which are determined for the input means,
   said weighting means comprising a chalcogenide semiconductor, a predetermined proportion of said chalcogenide semiconductor being transferred to a low resistive crystallized state and the remaining proportion thereof being in a high resistive amorphous state; and
   operating means to which the signals respectively having the weights added thereto by said weighting means are respectively applied from said input means,
   said operating means adding said signals applied from the respective input means and deriving a predetermined output signal when the total amount of the signals exceeds a predetermined reference amount.

2. The Neuro device according to claim 1, wherein said weighting means comprises
   a first electrode;
   a second electrode opposed to the first electrode, the spacing between the opposed first and second electrodes being the smallest in one end of a space between the opposed first and second electrodes, while being the largest in the other end thereof, and
   a chalcogenide semiconductor with which said space between the opposed first and second electrodes is filled.

3. The Neuro device according to claim 2, wherein
   a proportion of the chalcogenide semiconductor which corresponds to the weight added is transferred to said low resistive crystallized state sequentially from the narrowest space between the opposed first and second electrodes to the widest space therebetween by previously applying a predetermined write voltage to the space between the opposed first and second electrodes.

4. The Neuro device according to claim 1, wherein said weighting means comprises
   a first electrode,
   a second electrode opposed to the first electrode, the spacing between the opposed first and second electrodes being the smallest in one end of the space between the opposed first and second electrodes, while being the largest in the other end thereof,
   a chalcogenide semiconductor layer disposed in a predetermined proportion of said space between the opposed first and second electrodes, extending in a direction parallel to the first electrode or the second electrode, and having a predetermined thickness which is not more than the smallest spacing between the opposed first and second electrodes, and a resistor layer with which the remaining proportion of the space between the opposed first and second electrodes is filled.

5. The Neuro device according to claim 4, wherein a proportion of the chalcogenide semiconductor which corresponds to the weight added is transferred to said low resistive crystallized state sequentially from the narrowest space between the opposed first and second electrodes to the widest space therebetween by previously applying a predetermined write voltage to the space between the opposed first and second electrodes.

6. A variable resistor comprising:
a plurality of pairs of opposed electrodes which differ in spacing;
a chalcogenide semiconductor with which spaces between said pairs of opposed electrodes are filled; and
connecting means for electrically connecting said plurality of pairs of opposed electrodes in parallel.

7. The variable resistor according to claim 6, wherein
the chalcogenide semiconductor with which the spaces between a predetermined number of pairs of opposed electrodes having relatively large spacing out of said plurality of pairs of opposed electrodes are filled is in a high resistive amorphous state, and
the chalcogenide semiconductor with which the spaces between the remaining number of pairs of opposed electrodes having relatively small spacing are filled is in a low resistive crystallized state.

8. The variable resistor according to claim 6, wherein
said plurality of pairs of opposed electrodes and said connecting means comprise a pair of opposed electrodes,
the spacing between said pair of opposed electrodes is the smallest in one end of the space between the opposed electrodes, while being the widest in the other end thereof.

9. The variable resistor according to claim 8, wherein
the chalcogenide semiconductor with which a predetermined proportion of the space between said pair of opposed electrodes whose spacing is relatively large is filled is in a high resistive amorphous state, and
the chalcogenide semiconductor with which the remaining proportion of the space between the pair of opposed electrodes whose spacing is relatively small is filled is in a low resistive crystallized state.

10. The variable resistor according to claim 6, wherein
said chalcogenide semiconductor comprises a compound expressed by the following molecular formula:

$As_X S_{(1-X)}$, where $0<X<1$.

11. The variable resistor according to claim 6, wherein
said chalcogenide semiconductor comprises a compound in the form expressed by the following equation:
$Ge_A Te_B X_C Y_D$, where A, B, C and D are natural numbers, and $A+B+C+D=100$.

12. The variable resistor according to claim 11, wherein
said chalcogenide semiconductor comprises a compound expressed by the following molecular formula:

$Ge_{24} Te_{72} Sb_2 S_2$.

13. A variable resistor comprising:
a plurality of chalcogenide semiconductor layers which are equal in thickness;
resistors which are respectively connected in series with said chalcogenide semiconductor layers and differ in resistance value; and
connecting means for electrically connecting series connections of said chalcogenide semiconductor layers and the resistors in parallel.

14. The variable resistor according to claim 13, wherein
a predetermined number of chalcogenide semiconductor layer with which the resistors having a relatively high resistance value are connected in series out of the plurality of chalcogenide semiconductor layers are in a high resistive amorphous state, and
the remaining number of chalcogenide semiconductor layers to which the resistors having a relatively low resistance value are connected are in a low resistive crystallized state.

15. The variable resistor according to claim 13, wherein the series connections of said plurality of chalcogenide semiconductor layers and the resistors and the connecting means comprise
a first electrode,
a second electrode opposed to the first electrode, the spacing between the opposed first and second electrodes being the smallest in one end of a space between the opposed first and second electrodes, while being the largest in the other end thereof,
a chalcogenide semiconductor layer disposed in a predetermined proportion of said space between the opposed first and second electrodes, extending in a direction parallel to the first electrode or the second electrode, and having a predetermined thickness which is not more than the smallest spacing between the opposed first and second electrodes, and
a resistor layer with which the remaining proportion of the space between the opposed first and second electrodes is filled.

16. The variable resistor according to claim 15, wherein
a predetermined proportion of the chalcogenide semiconductor layer is transferred to the low resistive crystallized state sequentially from the narrowest space between the opposed first and second electrodes to the widest space therebetween, while the remaining proportion of the chalcogenide semiconductor layer is in the high resistive amorphous state by previously applying a predetermined write voltage to the space between the opposed first and second electrodes.

17. The variable resistor according to claim 13, wherein
said chalcogenide semiconductor layer comprises a compound expressed by the following molecular formula:

$As_X S_{(1-X)}$, where $0<X<1$.

18. The variable resistor according to claim 13, wherein said chalcogenide semiconductor layer comprises a compound in the form expressed by the following molecular formula:

$Ge_A\ Te_B\ X_C\ Y_D$, where A, B, C and D are natural numbers, and $A+B+C+D=100$.

19. The variable resistor according to claim 18, wherein said chalcogenide semiconductor layer comprises a compound expressed by the following molecular formula:

$Ge_{24}\ Te_{72}\ Sb_2\ S_2$

* * * * *